United States Patent
Nakata

(10) Patent No.: US 12,537,509 B2
(45) Date of Patent: *Jan. 27, 2026

(54) ACOUSTIC WAVE FILTER AND MULTIPLEXER

(71) Applicant: Murata Manufacturing Co., Ltd., Nagaokakyo (JP)

(72) Inventor: Shunsuke Nakata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 355 days.

This patent is subject to a terminal disclaimer.

(21) Appl. No.: 18/102,860

(22) Filed: Jan. 30, 2023

(65) Prior Publication Data

US 2023/0179173 A1    Jun. 8, 2023

Related U.S. Application Data

(63) Continuation of application No. PCT/JP2021/026760, filed on Jul. 16, 2021.

(30) Foreign Application Priority Data

Jul. 31, 2020    (JP) .................. 2020-130840

(51) Int. Cl.
   *H03H 9/54*     (2006.01)
   *H03H 9/205*    (2006.01)
   *H03H 9/70*     (2006.01)

(52) U.S. Cl.
   CPC ............. *H03H 9/54* (2013.01); *H03H 9/205* (2013.01); *H03H 9/70* (2013.01)

(58) Field of Classification Search
   CPC   H03H 9/54; H03H 9/205; H03H 9/70; H03H 9/6436; H03H 9/6483

USPC ................................................ 333/193–196
See application file for complete search history.

(56) References Cited

U.S. PATENT DOCUMENTS

| | | | |
|---|---|---|---|
| 11,876,505 B2* | 1/2024 | Uesaka | ................ H03H 9/6436 |
| 11,916,542 B2* | 2/2024 | Uesaka | .................... H03H 9/72 |
| 2003/0164745 A1 | 9/2003 | Takamine | |
| 2013/0214873 A1 | 8/2013 | Takamine | |

(Continued)

FOREIGN PATENT DOCUMENTS

| | | |
|---|---|---|
| CN | 110771040 A | 2/2020 |
| JP | 2003324335 A | 11/2003 |

(Continued)

OTHER PUBLICATIONS

International Search Report in PCT/JP2021/026760, mailed Oct. 5, 2021, 3 pages.

(Continued)

*Primary Examiner* — Jorge L Salazar, Jr.
(74) *Attorney, Agent, or Firm* — Keating & Bennett, LLP

(57) ABSTRACT

An acoustic wave filter includes a first input terminal and a first output terminal, and a longitudinally coupled resonator coupled between the first input terminal and the first output terminal. The longitudinally coupled resonator includes one or more input-side resonators coupled to the first input terminal and one or more output-side resonators coupled to the first output terminal. A total electrostatic capacitance of the one or more input-side resonators is less than a total electrostatic capacitance of the one or more output-side resonators.

20 Claims, 8 Drawing Sheets

(56) References Cited

U.S. PATENT DOCUMENTS

| | | |
|---|---|---|
| 2017/0331456 A1 | 11/2017 | Ono |
| 2018/0041192 A1 | 2/2018 | Shoda |
| 2019/0222199 A1 | 7/2019 | Nosaka |
| 2020/0067489 A1 | 2/2020 | Takata |
| 2020/0112299 A1 | 4/2020 | Muranaka |

FOREIGN PATENT DOCUMENTS

| | | | |
|---|---|---|---|
| JP | 2017204743 A | | 11/2017 |
| JP | 2018023074 A | | 2/2018 |
| WO | 2012056767 A1 | | 5/2012 |
| WO | 2018061783 A1 | | 4/2018 |
| WO | 2018225650 A1 | | 12/2018 |

OTHER PUBLICATIONS

Written Opinion in PCT/JP2021/026760, mailed Oct. 5, 2021, 6 pages.
Official Communication issued in corresponding Chinese Patent Application No. 202180060599.6, mailed on Jun. 28, 2025, 8 pages.

\* cited by examiner

ACOUSTIC WAVE FILTER AND MULTIPLEXER

CROSS REFERENCE TO RELATED APPLICATIONS

This application claims the benefit of priority to Japanese Patent Application No. 2020-130840 filed on Jul. 31, 2020 and is a Continuation Application of PCT Application No. PCT/JP2021/026760 filed on Jul. 16, 2021. The entire contents of each application are hereby incorporated herein by reference.

BACKGROUND OF THE INVENTION

1. Field of the Invention

The present invention relates to an acoustic wave filter and a multiplexer.

2. Description of the Related Art

In recent years, to implement carrier aggregation with communication devices such as mobile phone terminals, multiplexers (dividers) for separating (dividing) radio-frequency signals according to different frequency bands are widely used. For example, Japanese Unexamined Patent Application Publication No. 2018-23074 discloses an acoustic wave filter including a longitudinally coupled resonator. Such an acoustic wave filter is coupled with other filters by a common terminal by common connection to form a multiplexer.

SUMMARY OF THE INVENTION

With the acoustic wave filter disclosed in Japanese Unexamined Patent Application Publication No. 2018-23074, the convergence level of impedance can be degraded. In this case, when the acoustic wave filter is coupled with other filters by common connection, the return loss characteristic of the acoustic wave filter with respect to the common terminal deteriorates.

Preferred embodiments of the present invention provide acoustic wave filters and the like that improve a convergence level of impedance.

An acoustic wave filter according to an aspect of a preferred embodiment of the present invention includes a first input terminal and a first output terminal, and a longitudinally coupled resonator coupled between the first input terminal and the first output terminal. The longitudinally coupled resonator includes one or more input-side resonators coupled to the first input terminal and one or more output-side resonators coupled to the first output terminal. A total electrostatic capacitance of the one or more input-side resonators is less than a total electrostatic capacitance of the one or more output-side resonators.

An acoustic wave filter according to an aspect of a preferred embodiment of the present invention includes a first input terminal and a first output terminal, and a longitudinally coupled resonator coupled between the first input terminal and the first output terminal. The longitudinally coupled resonator includes one or more input-side resonators coupled to the first input terminal and one or more output-side resonators coupled to the first output terminal. The one or more input-side resonators and the one or more output-side resonators each include an interdigital transducer (IDT) electrode including a plurality of electrode fingers. A total of a product of a number of pairs of a plurality of electrode fingers of the IDT electrode and an overlap width of the electrode fingers of the individual one or more input-side resonators is smaller than a total of a product of a number of pairs of a plurality of electrode fingers of the IDT electrode and an overlap width of the electrode fingers of the individual one or more output-side resonators.

A multiplexer according to an aspect of a preferred embodiment of the present invention includes a common terminal, an acoustic wave filter according to a preferred embodiment of the present invention described above, and one or more filters each including an input terminal and an output terminal. The first input terminal and the input terminal or the output terminal of each of the one or more filters are coupled to the common terminal.

Acoustic wave filters and the like according to preferred embodiments of the present invention improve the convergence level of impedance.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
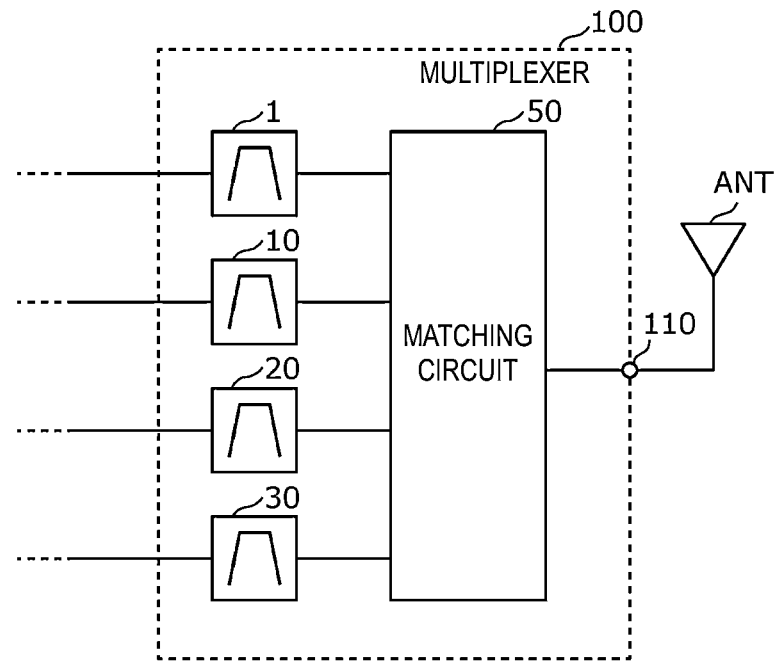
FIG. 1 is a configuration diagram illustrating an example of a multiplexer according to a preferred embodiment of the present invention.

Hereinafter, preferred embodiments of the present invention will be described in detail with reference to the drawings. It should be noted that the preferred embodiments described below are examples. Specifics including numerical values, shapes, materials, elements, arrangements of the elements, and modes of connection given in the following preferred embodiments are mere examples and are not intended to limit the present invention. Among the elements in the following preferred embodiment, elements not recited in any of the independent claims are described as arbitrary elements. Furthermore, the size or the size ratio of the elements illustrated in the drawings is not necessarily presented in an exact manner. Like reference characters are used to denote substantially like configurations in the drawings, and redundant descriptions thereof may be omitted or simplified. Further, in the preferred embodiments described below, "coupled" includes, as well as the state of being directly connected, the state of being electrically coupled via another element.

PREFERRED EMBODIMENT

1. Configuration of Multiplexer

FIG. 1 is a configuration diagram illustrating an example of a multiplexer 100 according to a preferred embodiment. FIG. 1 also illustrates an antenna element ANT coupled to a common terminal 110 of the multiplexer 100. The antenna element ANT is, for example, an antenna supporting multiple bands in conformity to a communication standard such as Long Term Evolution (LTE).

The multiplexer 100 is a divider/combiner circuit using an acoustic wave filter. In this example, a quadplexer is presented as an example. The multiplexer 100 includes the common terminal 110, an acoustic wave filter, one or more filters, and a matching circuit 50. The acoustic wave filter and one or more filters include an input terminal and an output terminal. For example, a filter 1 is an example of the acoustic wave filter, and filters 10, 20, and 30 are an example of the one or more filters. The input or output terminal of each of the filters 1, 10, 20, and 30 are coupled to the common terminal 110 by common connection via the matching circuit 50.

The common terminal 110 is common to the four filters 1, 10, 20, and 30. The common terminal 110 is coupled to the filters 1, 10, 20, and 30 inside the multiplexer 100. The common terminal 110 is coupled to the antenna element ANT outside the multiplexer 100. This means that the common terminal 110 also defines and functions as an antenna terminal of the multiplexer 100.

For example, the filters 1, 10, 20, and 30 are coupled to an RF signal processing circuit (a radio frequency integrated circuit (RFIC)) outside the multiplexer 100 via, for example, an amplifier circuit.

For example, the pass band of each of the filters 1, 10, 20, and 30 is included in the range of about 1.4 GHz to about 2.7 GHz.

The filter 1 is an acoustic wave filter. For example, the filter 1 is a receive filter, and the pass band of the filter 1 is LTE Band 32 Rx (about 1.452 GHz to about 1.496 GHz). Details of the configuration of the filter 1 will be described later.

The filter 10 is a first filter coupled with the filter 1 by common connection. The filter 10 may be an acoustic wave filter or LC filter. For example, the filter 10 is a receive filter, and the pass band is the filter 10 is LTE Band 3 Rx (about 1.805 GHz to about 1.880 GHz).

The filter 20 is a second filter coupled with the filter 1 by common connection. The filter 20 may be an acoustic wave filter or LC filter. For example, the filter 20 is a receive filter, and the pass band of the filter 20 is LTE Band 1 Rx (about 2.110 GHz to about 2.170 GHz).

The filter 30 is a third filter coupled with the filter 1 by common connection. The filter 30 may be an acoustic wave filter or LC filter. For example, the filter 30 is a receive filter, and the pass band is the filter 30 is LTE Band 7 Rx (about 2.620 GHz to about 2.690 GHz).

As described above, the filters have, for example, different pass band widths, and the single multiplexer 100 can support a plurality of frequency bands, in other words, implement carrier aggregation.

The combination of the pass bands of the four filters 1, 10, 20, and 30 is not limited to the combination of Band 32 Rx, Band 3 Rx, Band 1 Rx, and Band 7 Rx. It is sufficient that the number of filters coupled to the common terminal 110 be two or more. The multiplexer 100 may include only a plurality of transmit filters, or may include both receive filters and transmit filters.

The matching circuit 50 includes a plurality of matching elements. The matching circuit 50 is a circuit to provide matching between the antenna element ANT and the filters 1, 10, 20, and 30. The matching element is, for example, an inductor or capacitor. Usually, matching is provided for a filter to achieve an impedance of about 50Ω, for example. However, when a multiplexer includes the filter coupled with other filters by common connection, the impedance is shifted from about 50Ω due to the effect of the other filters. When the filters are coupled by common connection, the matching circuit 50 provides matching for the individual filters to achieve an impedance of about 50Ω. However, to provide matching for the individual filters to achieve an impedance of about 50Ω, the number of matching elements included in the matching circuit 50 may be increased. In view of limitations of component mounting area and deterioration of characteristics, it is desirable that impedance matching be provided for filters using fewer elements. In a preferred embodiment of the present invention, the filter 1 enables impedance matching for filters using fewer elements.

2. Configuration of Filter

The following describes a configuration of the filter 1 according to the present preferred embodiment.

Figure 2:
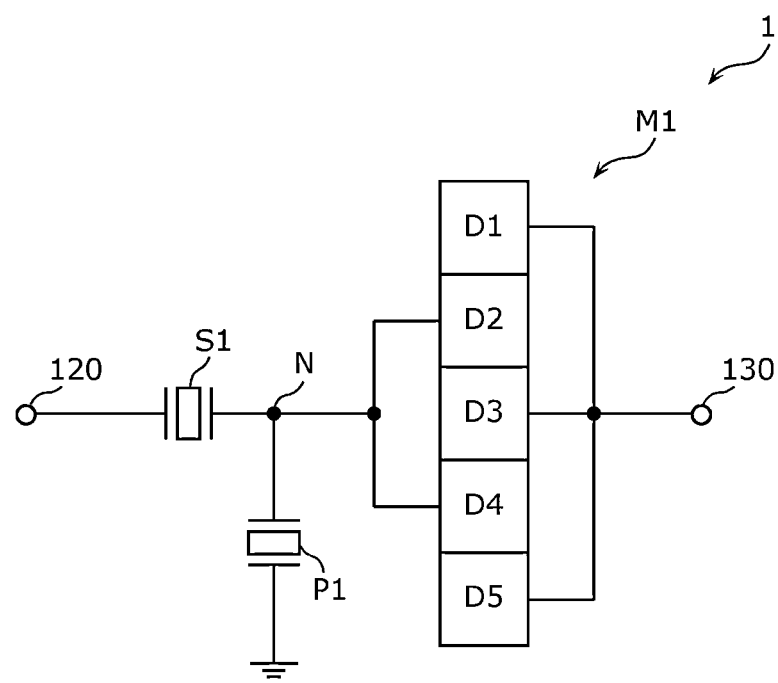
FIG. 2 is a circuit configuration diagram illustrating an example of an acoustic wave filter according to a preferred embodiment of the present invention.

FIG. 2 is a circuit configuration diagram illustrating an example of the filter 1 according to the present preferred embodiment.

The filter 1 includes a first input terminal 120 and a first output terminal 130, and a longitudinally coupled resonator M1. The first input terminal 120 is coupled to the common terminal 110. The filter 1 also includes a series arm resonator S1 and a parallel arm resonator P1.

The longitudinally coupled resonator M1 is coupled between the first input terminal 120 and the first output terminal 130. The longitudinally coupled resonator M1 includes one or more input-side resonators coupled to the first input terminal 120 via the series arm resonator S1 and one or more output-side resonators coupled to the first output terminal 130. The one or more input-side resonators and the one or more output-side resonators each include an interdigital transducer (IDT) electrode including a plurality of electrode fingers. The at least one output-side resonator may be coupled to the first output terminal 130 via another resonator. For example, the longitudinally coupled resonator M1 is a longitudinally coupled resonator including five electrodes. The one or more input-side resonators are resonators D2 and D4, and the one or more output-side resonators are resonators D1, D3, and D5. The number of input-side resonators and the number of output-side resonators are not limited to this example. The number of input-side resonators and the number of output-side resonators may be any number equal to or greater than one.

The series arm resonator S1 is provided in a path connecting the first input terminal 120 to the longitudinally coupled resonator M1. The parallel arm resonator P1 is coupled between a node N in the path connecting the first input terminal 120 to the longitudinally coupled resonator M1 and the ground.

The longitudinally coupled resonator M1, the series arm resonator S1, and the parallel arm resonator P1 determine the pass band of the filter 1. The filter 1 is designed such that the resonant frequency of the series arm resonator S1 and the anti-resonant frequency of the parallel arm resonator P1 are within the pass band of the filter 1. The filter 1 is designed also such that the anti-resonant frequency of the series arm resonator S1 is at the attenuation pole close to the high-frequency side of the pass band of the filter 1, and the resonant frequency of the parallel arm resonator P1 is at the attenuation pole close to the low-frequency side of the pass band of the filter 1.

A preferred embodiment of the present invention has a feature in the relationship between the one or more input-side resonators and the one or more output-side resonators included in the longitudinally coupled resonator M1 with respect to the total electrostatic capacitance. Specifically, the total electrostatic capacitance of the one or more input-side resonators is less than the total electrostatic capacitance of the one or more output-side resonators. The following describes, as a practical example, the case in which the total electrostatic capacitance of the one or more input-side resonators (the resonators D2 and D4) is less than the total electrostatic capacitance of the one or more output-side resonators (the resonators D1, D3, and D5), and as a comparative example, the case in which the total electrostatic capacitance of the one or more input-side resonators (the resonators D2 and D4) is equal to or more than the total electrostatic capacitance of the one or more output-side resonators (the resonators D1, D3, and D5). By changing the product of the number of pairs of electrode fingers of an IDT electrode in a resonator and the overlap width of the electrode fingers, the electrostatic capacitance of the resonator can be changed. This is because the electrostatic capacitance of a resonator is almost proportional to the product of the number of pairs of electrode fingers of an IDT electrode in the resonator and the overlap width of the electrode fingers. For this reason, the following also describes, as a practical example, the case in which the total of the one or more input-side resonators (the resonators D2 and D4) with respect to the product of the number of pairs of electrode fingers of an IDT electrode in each resonator and the overlap width of the electrode fingers is smaller than the total of the one or more output-side resonators (the resonators D1, D3, and D5) with respect to the product of the number of pairs of electrode fingers of an IDT electrode in each resonator and the overlap width of the electrode fingers. For this reason, the following also describes, as a comparative example, the case in which the total of the one or more input-side resonators (the resonators D2 and D4) with respect to the product of the number of pairs of electrode fingers of an IDT electrode in each resonator and the overlap width of the electrode fingers is equal to or greater than the total of the one or more output-side resonators (the resonators D1, D3, and D5) with respect to the product of the number of pairs of electrode fingers of an IDT electrode in each resonator and the overlap width of the electrode fingers.

3. Comparative Example

The following describes the comparative example in which the total electrostatic capacitance of the resonators D2 and D4 is equal to or more than the total electrostatic capacitance of the resonators D1, D3, and D5. The circuit configuration of a filter according to the comparative example is the same as the circuit configuration of the filter 1 according to the practical example. The filter according to the comparative example includes the longitudinally coupled resonator M1, the series arm resonator S1, and the parallel arm resonator P1. The pass band of the filter according to the comparative example is the same as the pass band of the filter 1 according to the practical example. However, the longitudinally coupled resonator M1 according to the comparative example is different from the longitudinally coupled resonator M1 according to the practical example in the electrostatic capacitance of the resonators D1, D2, D3, D4, and D5.

For example, in the comparative example, the overlap width of a plurality of electrode fingers of an IDT electrode of the individual resonators D1, D2, D3, D4, and D5 is the same, and the number of pairs of electrode fingers is determined as in Table 1.

TABLE 1

| Resonator | D1 | D2 | D3 | D4 | D5 |
|---|---|---|---|---|---|
| Pair count (pair) | 12.5 | 43 | 19 | 43 | 12.5 |

When the number of pairs of electrode fingers of an IDT electrode is n (pairs), the total number of electrode fingers is given by 2n+1 (pieces). According to this, for example, an IDT electrode in which the number of pairs of electrode fingers=12.5 (pairs) denotes an IDT electrode in which the number of electrode fingers=25 (pieces). For example, the number of pairs of electrode fingers of an IDT electrode of each of the resonators D2 and D4 is more than the number of pairs of electrode fingers of an IDT electrode of each of the resonators D1, D3, and D5. In other words, because the overlap width of electrode fingers of an IDT electrode of the individual resonators D1, D2, D3, D4, and D5 is the same, the product of the number of pairs of electrode fingers of an IDT electrode and the overlap width of the electrode fingers of each of the resonators D2 and D4 is greater than the product of the number of pairs of electrode fingers and the overlap width of the electrode fingers of an IDT electrode of each of the resonators D1, D3, and D5. As a result, the electrostatic capacitance of each of the resonators D2 and D4 is more than the electrostatic capacitance of each of the resonators D1, D3, and D5.

Figure 3A:
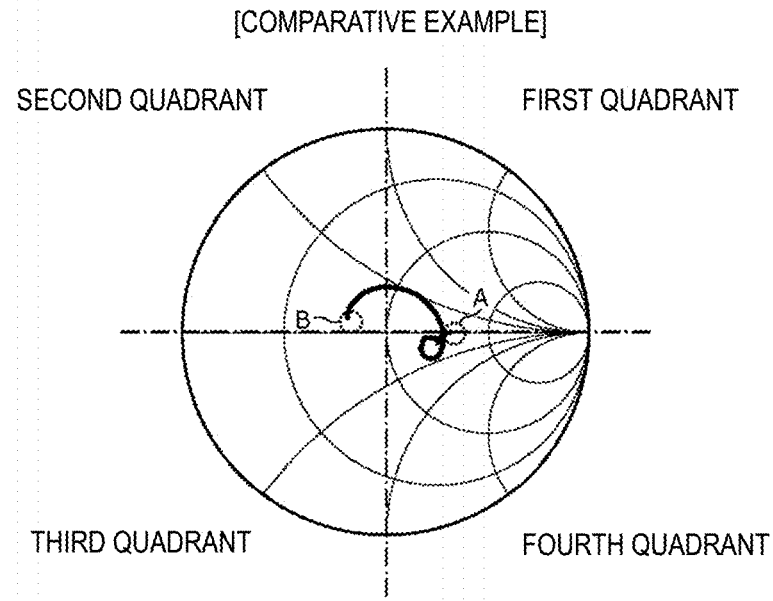
FIG. 3A is a Smith chart illustrating the impedance characteristic of a longitudinally coupled resonator according to a comparative example when the longitudinally coupled resonator is viewed from a first input terminal side.

FIG. 3A is a Smith chart illustrating the impedance characteristic of the longitudinally coupled resonator M1 according to the comparative example when the longitudinally coupled resonator M1 is viewed from the first input terminal 120 side. In other words, FIG. 3A illustrates the impedance characteristic when only the longitudinally coupled resonator M1 is viewed from the node N in FIG. 2.

Figure 3B:
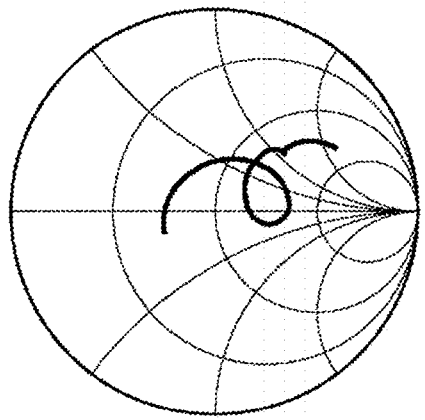
FIG. 3B is a Smith chart illustrating the impedance characteristic of an acoustic wave filter according to the comparative example when the acoustic wave filter is viewed from the first input terminal side.

FIG. 3B is a Smith chart illustrating the impedance characteristic of the filter according to the comparative example when the filter is viewed from the first input terminal 120 side. In other words, FIG. 3B illustrates the impedance characteristic when the filter according to the comparative example, including the series arm resonator S1, the parallel arm resonator P1, and the longitudinally coupled resonator M1, is viewed from the first input terminal 120 illustrated in FIG. 2.

Regarding the Smith charts including Smith charts described later, the center of each Smith chart indicates about 50Ω.

As illustrated in FIG. 3A, the impedance of the longitudinally coupled resonator M1 according to the comparative example when viewed from the first input terminal 120 side is close to about 50Ω in the pass band of the filter according to the comparative example. As illustrated in FIG. 3B, the impedance of the filter according to the comparative example when viewed from the first input terminal 120 side is close to about 50Ω in the pass band of the filter according to the comparative example. The impedance characteristic illustrated in each of FIGS. 3A and 3B indicates that the convergence level of impedance is not desirable. The convergence level of impedance indicates how close three points of the low-frequency end, middle, and high-frequency end of a pass band converge. The closer the three points converge, the lower the convergence level is, which can be considered as a desirable convergence level. The convergence level of impedance is 1.69 in FIG. 3A and 2.71 in FIG. 3B.

4. Practical Example

The following describes the practical example in which the total electrostatic capacitance of the resonators D2 and D4 is less than the total electrostatic capacitance of the resonators D1, D3, and D5.

For example, in the practical example, the overlap width of a plurality of electrode fingers of an IDT electrode of the individual resonators D1, D2, D3, D4, and D5 is the same, and the number of pairs of electrode fingers is determined as in Table 2.

TABLE 2

| Resonator | D1 | D2 | D3 | D4 | D5 |
|---|---|---|---|---|---|
| Pair count (pair) | 47.5 | 14 | 53 | 14 | 45.5 |

For example, the number of pairs of electrode fingers of an IDT electrode of each of the resonators D2 and D4 is fewer than the number of pairs of electrode fingers of an IDT electrode of each of the resonators D1, D3, and D5. In other words, because the overlap width of electrode fingers of an IDT electrode of the individual resonators D1, D2, D3, D4, and D5 is the same, the product of the number of pairs of electrode fingers of an IDT electrode and the overlap width of the electrode fingers of each of the resonators D2 and D4 is smaller than the product of the number of pairs of electrode fingers and the overlap width of the electrode fingers of an IDT electrode of each of the resonators D1, D3, and D5. As a result, the electrostatic capacitance of each of the resonators D2 and D4 is less than the electrostatic capacitance of each of the resonators D1, D3, and D5.

Figure 4A:
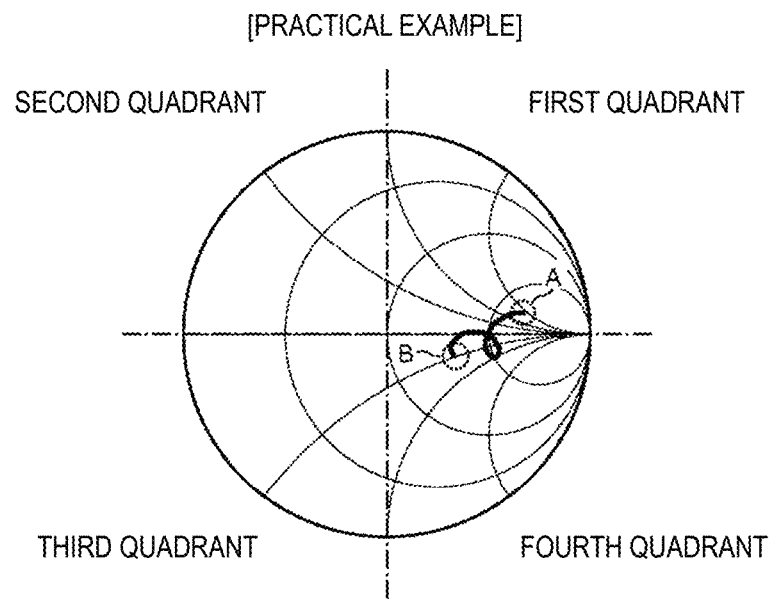
FIG. 4A is a Smith chart illustrating the impedance characteristic of a longitudinally coupled resonator according to a practical example when the longitudinally coupled resonator is viewed from a first input terminal side.

FIG. 4A is a Smith chart illustrating the impedance characteristic of the longitudinally coupled resonator M1 according to the practical example when the longitudinally coupled resonator M1 is viewed from the first input terminal 120 side. In other words, FIG. 4A illustrates the impedance characteristic when only the longitudinally coupled resonator M1 is viewed from the node N in FIG. 2.

Figure 4B:
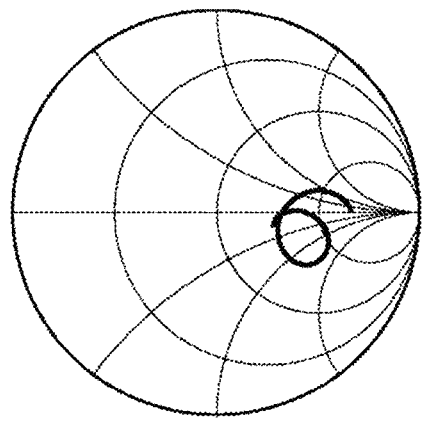
FIG. 4B is a Smith chart illustrating the impedance characteristic of an acoustic wave filter according to the practical example when the acoustic wave filter is viewed from the first input terminal side.

FIG. 4B is a Smith chart illustrating the impedance characteristic of the filter 1 according to the practical example when the filter is viewed from the first input terminal 120 side. In other words, FIG. 4B illustrates the impedance characteristic when the filter 1 according to the practical example, including the series arm resonator S1, the parallel arm resonator P1, and the longitudinally coupled resonator M1, is viewed from the first input terminal 120 illustrated in FIG. 2.

As illustrated in FIG. 4A, the impedance of the longitudinally coupled resonator M1 according to the practical example when viewed from the first input terminal 120 side is higher than about 50Ω in the pass band of the filter 1 according to the practical example. As illustrated in FIG. 4B, the impedance of the filter 1 according to the practical example when viewed from the first input terminal 120 side is higher than about 50Ω in the pass band of the filter 1 according to the practical example. The impedance characteristic illustrated in each of FIGS. 4A and 4B indicates that the convergence level of impedance is more desirable than the comparative example. The convergence level of impedance is about 1.49 in FIG. 4A and about 1.50 in FIG. 4B.

In the practical example, the impedance of the longitudinally coupled resonator M1 at the high-frequency end of the pass band of the filter 1 when viewed from the first input terminal 120 side is positioned in a first quadrant of the Smith chart, and the impedance of the longitudinally coupled resonator M1 at the low-frequency end of the pass band of the filter 1 when viewed from the first input terminal 120 side is positioned in a fourth quadrant of the Smith chart. Because the total electrostatic capacitance of the resonators D2 and D4 is less the total electrostatic capacitance of the resonators D1, D3, and D5, it is possible to position the impedance at the high-frequency end of the pass band of the filter 1 in the first quadrant and the impedance at the low-frequency end in the fourth quadrant. It can be understood that as illustrated in FIG. 4A, the impedance at the high-frequency end of the pass band of the filter 1 (a portion A in FIG. 4A) is positioned in the first quadrant, and the impedance at the low-frequency end of the pass band of the filter 1 (a portion B in FIG. 4A) is positioned in the fourth quadrant.

By contrast, in the comparative example, the impedance of the longitudinally coupled resonator M1 at the high-frequency end of the pass band of the filter according to the comparative example when viewed from the first input terminal 120 side is positioned close to the boundary between the first quadrant and the fourth quadrant of the Smith chart, and the impedance of the longitudinally coupled resonator M1 at the low-frequency end of the pass band of the filter according to the comparative example when viewed from the first input terminal 120 side is positioned in a second quadrant of the Smith chart. It can be understood that as illustrated in FIG. 3A, the impedance at the high-frequency end of the pass band of the filter according to the comparative example (a portion A in FIG. 3A) is positioned close to the boundary between the first quadrant and the fourth quadrant, and the impedance at the low-frequency end of the pass band of the filter according to the comparative example (a portion B in FIG. 3A) is positioned in the second quadrant.

In a Smith chart, when a first line indicates a pure resistance, and a second line connects the point at 90° phase in the outer circumference of the Smith chart and the point of a reference impedance, a first quadrant, a second quadrant, a third quadrant, and a fourth quadrant of the Smith chart are four quadrants divided by the first and second lines. Of the four quadrants, an upper right quadrant is the first quadrant, in the counterclockwise order from the upper right quadrant, an upper left quadrant is the second quadrant, a lower left quadrant is the third quadrant, and a lower right quadrant is the fourth quadrant.

As in the practical example, when the impedance of the longitudinally coupled resonator M1 at the high-frequency end of the pass band of the filter 1 when viewed from the first input terminal 120 side is positioned in the first quadrant of the Smith chart, and the impedance of the longitudinally coupled resonator M1 at the low-frequency end of the pass band of the filter 1 when viewed from the first input terminal 120 side is positioned in the fourth quadrant of the Smith chart, while the convergence level of impedance is maintained, the impedance of the filter 1 when viewed from the first input terminal 120 side can be shifted toward open (infinity) in the pass bands (also referred to as other filter bands) of the filters 10, 20, and 30 coupled by common connection. Specifically, by coupling the series arm resonator S1 and the parallel arm resonator P1 to the longitudinally coupled resonator M1 exhibiting the impedance characteristic as described above, while the convergence level of impedance is maintained, the impedance of the filter 1 when viewed from the first input terminal 120 side can be shifted toward infinity in the other filter bands. This will be described with reference to FIGS. 5A to 7C.

Figure 5A:
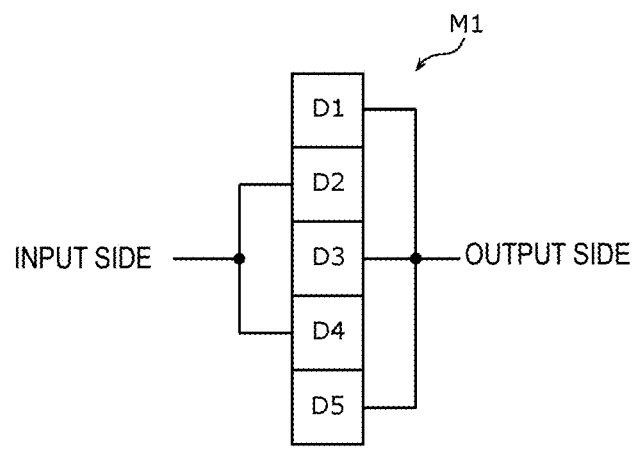
FIG. 5A is a circuit configuration diagram of the longitudinally coupled resonator according to the practical example.

FIG. 5A is a circuit configuration diagram of the longitudinally coupled resonator M1 according to the practical example.

Figure 5B:
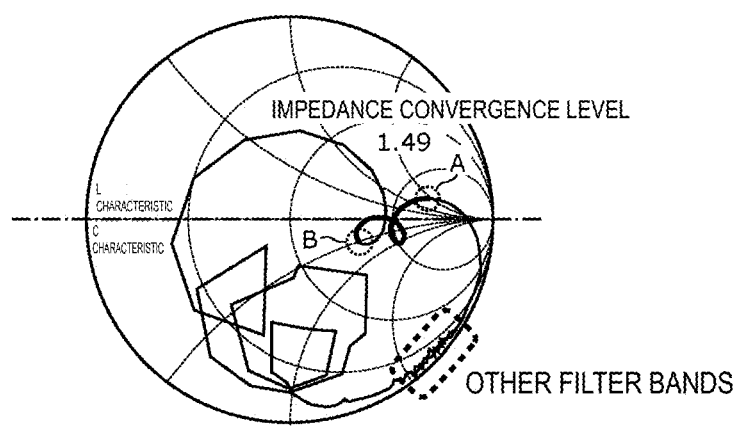
FIG. 5B is a Smith chart illustrating the impedance characteristic of the longitudinally coupled resonator according to the practical example when the longitudinally coupled resonator is viewed from the first input terminal side.

FIG. 5B is a Smith chart illustrating the impedance characteristic of the longitudinally coupled resonator M1 according to the practical example when the longitudinally coupled resonator M1 is viewed from the first input terminal 120 side.

FIG. 5A illustrates the longitudinally coupled resonator M1 when the series arm resonator S1 and the parallel arm resonator P1 are not coupled. In FIG. 5B, the impedance in the pass band of the filter 1 is indicated by a thick solid line, and the impedance outside the pass band of the filter 1 is indicated by a solid line. The upper semicircle region of the Smith chart is an inductive (the L characteristic) region, and the lower semicircle region of the Smith chart is a capacitive (the C characteristic) region. The impedance of the longitudinally coupled resonator M1 at the high-frequency end of the pass band of the filter 1 (a portion A in FIG. 5B) when viewed from the first input terminal 120 side is positioned in the first quadrant of the Smith chart, which indicates the inductive characteristic. The impedance of the longitudinally coupled resonator M1 at the low-frequency end of the pass band of the filter 1 (a portion B in FIG. 5B) when viewed from the first input terminal 120 side is positioned in the fourth quadrant of the Smith chart, which indicates the capacitive characteristic. The convergence level of impedance of the longitudinally coupled resonator M1 according to the practical example when viewed from the first input terminal 120 side is about 1.49 in the pass band of the filter 1.

When the filter 1 is coupled with other filters (for example, the filters 10, 20, and 30) by common connection in the multiplexer 100, for the purpose of reflecting signals of the other filter bands with the filter 1 to reduce or prevent degradation of the bandpass characteristic of the other filters, it is desirable to bring the impedance of the filter 1 close to infinity in the other filter bands. In other words, it is desirable that a section within a dashed-line frame in FIG. 5B, which indicates the impedance in the other filter bands, be shifted counterclockwise. To bring the impedance of the filter 1 close to infinity in the other filter bands, the series arm resonator S1 is coupled to the longitudinally coupled resonator M1.

Figure 6A:
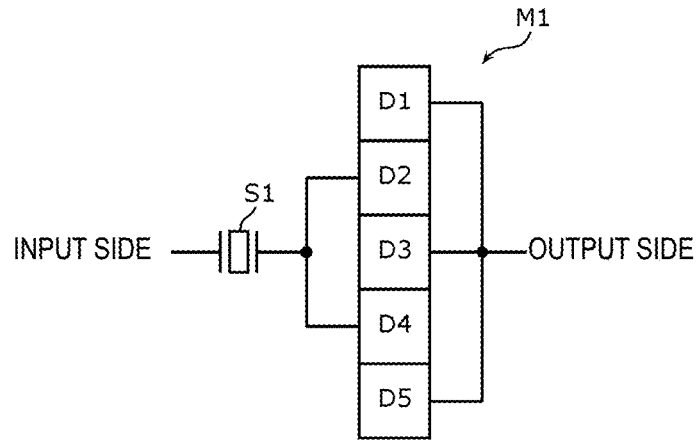
FIG. 6A is a circuit configuration diagram of the longitudinally coupled resonator coupled with a series arm resonator according to the practical example.

FIG. 6A is a circuit configuration diagram of the longitudinally coupled resonator M1 coupled with the series arm resonator S1 according to the practical example.

Figure 6B:
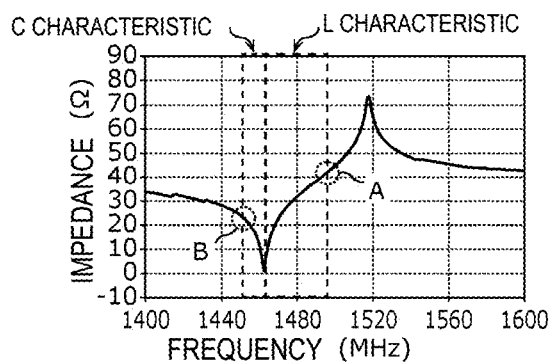
FIG. 6B is a graph illustrating the impedance characteristic of the series arm resonator according to the practical example.

FIG. 6B is a graph illustrating the impedance characteristic of the series arm resonator S1 according to the practical example.

Figure 6C:
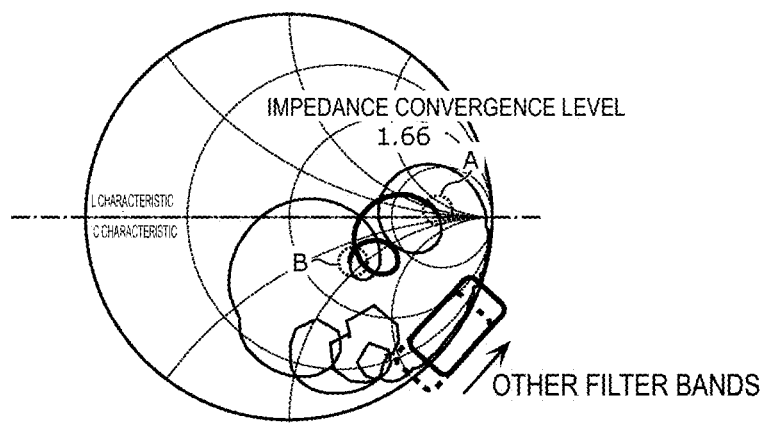
FIG. 6C is a Smith chart illustrating the impedance characteristic of the longitudinally coupled resonator coupled with the series arm resonator according to the practical example, when the longitudinally coupled resonator is viewed from the first input terminal side.

FIG. 6C is a Smith chart illustrating the impedance characteristic of the longitudinally coupled resonator M1 coupled with the series arm resonator S1 according to the practical example, when the longitudinally coupled resonator M1 is viewed from the first input terminal 120 side.

FIG. 6A illustrates the longitudinally coupled resonator M1 when the series arm resonator S1 is coupled, but the parallel arm resonator P1 is not coupled. FIG. 6B illustrates the impedance characteristic of the series arm resonator S1. An acoustic wave resonator is inductive in a frequency range between the resonant frequency and anti-resonant frequency of the acoustic wave resonator, whereas the acoustic wave resonator is capacitive in a frequency range lower than the resonant frequency and a frequency range higher than the anti-resonant frequency. The resonant frequency of the series arm resonator S1 is close to the center frequency of the pass band of the filter 1. The series arm resonator S1 is inductive in the frequency range between the high-frequency end of the pass band of the filter 1 (a portion A in FIG. 6B) and the resonant frequency. The series arm resonator S1 is capacitive in the frequency range between the low-frequency end of the pass band of the filter 1 (a portion B in FIG. 6B) and the resonant frequency. In the other filter bands, the series arm resonator S1 is capacitive.

In FIG. 6C, a section within a dashed-line frame indicates the impedance in the other filter bands before the series arm resonator S1 is coupled, and a section within a solid-line frame indicates the impedance in the other filter bands when the series arm resonator S1 is coupled. As illustrated in FIG. 6C, as the result of coupling the series arm resonator S1 to the longitudinally coupled resonator M1, the impedance in the other filter bands moves counterclockwise and approaches infinity. This is because the series arm resonator S1 is capacitive in the other filter bands.

However, it can be understood that although the convergence level of impedance is 1.49 before the series arm resonator S1 is coupled, the convergence level of impedance is degraded to 1.66 as the result of coupling the series arm resonator S1. This is because the impedance of the longitudinally coupled resonator M1 coupled with the series arm resonator S1 at the high-frequency end of the pass band of the filter 1 is further shifted in the inductive region of the Smith chart, as the longitudinally coupled resonator M1 is inductive at the high-frequency end of the pass band of the filter 1, and the series arm resonator S1 coupled to the longitudinally coupled resonator M1 is also inductive at the high-frequency end of the pass band of the filter 1. This is also because the impedance of the longitudinally coupled resonator M1 coupled with the series arm resonator S1 at the low-frequency end of the pass band of the filter 1 is further shifted in the capacitive region of the Smith chart, as the longitudinally coupled resonator M1 is capacitive at the low-frequency end of the pass band of the filter 1, and the series arm resonator S1 coupled to the longitudinally coupled resonator M1 is also capacitive at the low-frequency end of the pass band of the filter 1. To further improve the convergence level of impedance, the parallel arm resonator P1 is additionally coupled.

Figure 7A:
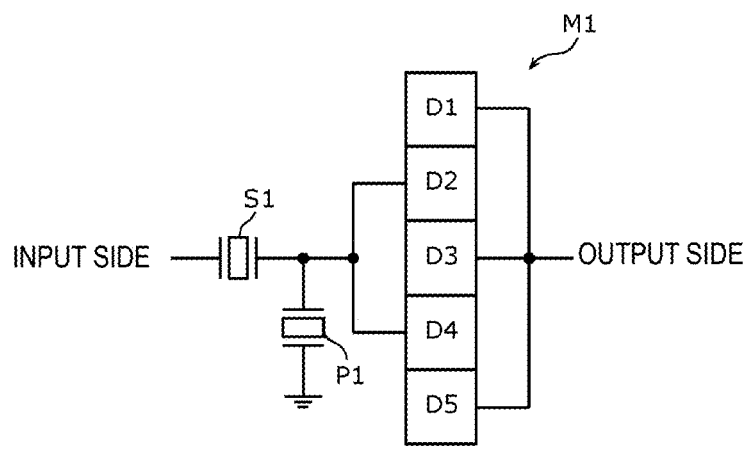
FIG. 7A is a circuit configuration diagram of the longitudinally coupled resonator coupled with the series arm resonator and a parallel arm resonator according to the practical example.

FIG. 7A is a circuit configuration diagram of the longitudinally coupled resonator M1 coupled with the series arm resonator S1 and the parallel arm resonator P1 according to the practical example.

Figure 7B:
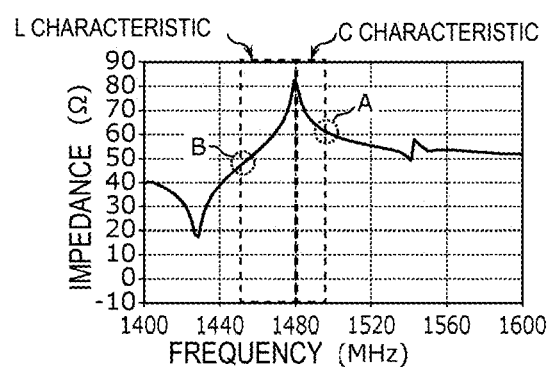
FIG. 7B is a graph illustrating the impedance characteristic of the parallel arm resonator according to the practical example.

FIG. 7B is a graph illustrating the impedance characteristic of the parallel arm resonator P1 according to the practical example.

Figure 7C:
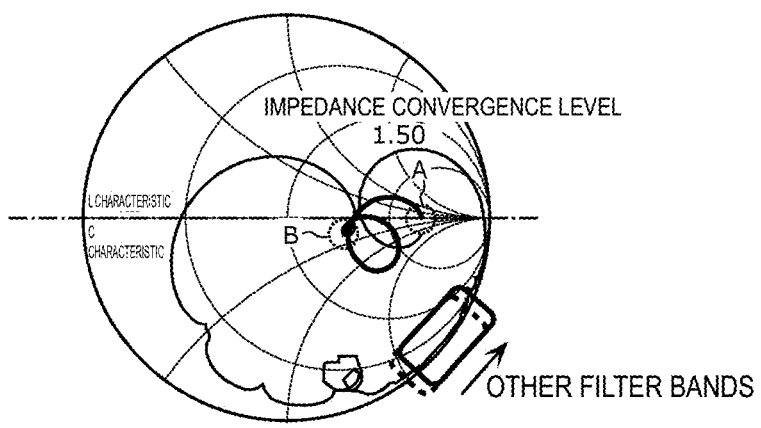
FIG. 7C is a Smith chart illustrating the impedance characteristic of the longitudinally coupled resonator coupled with the series arm resonator and the parallel arm resonator according to the practical example (that is, the acoustic wave filter), when the longitudinally coupled resonator is viewed from the first input terminal side.

FIG. 7C is a Smith chart illustrating the impedance characteristic of the longitudinally coupled resonator M1 coupled with the series arm resonator S1 and the parallel arm resonator P1 according to the practical example (that is, the filter 1), when the longitudinally coupled resonator M1 is viewed from the first input terminal 120 side.

FIG. 7A illustrates the longitudinally coupled resonator M1 when the series arm resonator S1 is coupled, and the parallel arm resonator P1 is coupled. In other words, FIG. 7A illustrates the filter 1. FIG. 7B illustrates the impedance characteristic of the parallel arm resonator P1. The resonant frequency of the parallel arm resonator P1 is close to the center frequency of the pass band of the filter 1. The parallel arm resonator P1 is inductive in the frequency range between the high-frequency end of the pass band of the filter 1 (a portion A in FIG. 7B) and the anti-resonant frequency. The parallel arm resonator P1 is capacitive in the frequency range between the low-frequency end of the pass band of the filter 1 (a portion B in FIG. 7B) and the anti-resonant frequency.

It can be understood that when the series arm resonator S1 is coupled before the parallel arm resonator P1 is coupled, the convergence level of impedance is about 1.66. However, as illustrated in FIG. 7C, after the parallel arm resonator P1 is coupled, the convergence level of impedance is changed to about 1.50. Thus, the convergence level of impedance before the series arm resonator S1 and the parallel arm resonator P1 are coupled is maintained. This is because the impedance of the longitudinally coupled resonator M1 coupled with the series arm resonator S1 and the parallel arm resonator P1 at the high-frequency end of the pass band of the filter 1 is shifted toward the capacitive region of the Smith chart, as the longitudinally coupled resonator M1 is inductive at the high-frequency end of the pass band of the filter 1, and the parallel arm resonator P1 coupled to the longitudinally coupled resonator M1 is capacitive at the high-frequency end of the pass band of the filter 1. This is also because the impedance of the longitudinally coupled resonator M1 coupled with the series arm resonator S1 and the parallel arm resonator P1 at the low-frequency end of the pass band of the filter 1 is shifted toward the inductive region of the Smith chart, as the longitudinally coupled resonator M1 is capacitive at the low-frequency end of the pass band of the filter 1, and the parallel arm resonator P1 coupled to the longitudinally coupled resonator M1 is inductive at the low-frequency end of the pass band of the filter 1. As such, it is possible to improve the convergence level of impedance degraded due to the effect of coupling the series arm resonator S1.

In FIG. 7C, a section within a dashed-line frame indicates the impedance in the other filter bands before the series arm resonator S1 and the parallel arm resonator P1 are coupled, and a section within a solid-line frame indicates the impedance in the other filter bands when the series arm resonator S1 and the parallel arm resonator P1 are coupled. As illustrated in FIG. 7C, as the result of coupling the series arm resonator S1 and the parallel arm resonator P1 to the longitudinally coupled resonator M1, the impedance in the other filter bands moves counterclockwise. It can be understood that the amount by which the impedance in the other filter bands when the series arm resonator S1 and the parallel arm resonator P1 are coupled moves counterclockwise is less than when only the series arm resonator S1 is coupled. However, the impedance in the other filter bands approaches closer to infinity than when both the series arm resonator S1 and the parallel arm resonator P1 are not coupled.

As described above, the series arm resonator S1 and the parallel arm resonator P1 are coupled to the longitudinally coupled resonator M1, the impedance of which at the high-frequency end of the pass band of the filter 1 when viewed from the first input terminal 120 side is in the first quadrant of the Smith chart, and the impedance of which at the low-frequency end of the pass band of the filter 1 when viewed from the first input terminal 120 side is in the fourth quadrant of the Smith chart. As a result, while the convergence level of impedance is maintained, the impedance of the filter 1 in the other filter bands when viewed from the first input terminal 120 side is shifted toward infinity.

5. Comparison Between Practical Example and Comparative Example

The following compares the practical example with the comparative example and explains that the return loss characteristic of the multiplexer 100 including the filter 1 according to a preferred embodiment of the present invention is improved as compared to the comparative example.

Figure 8A:
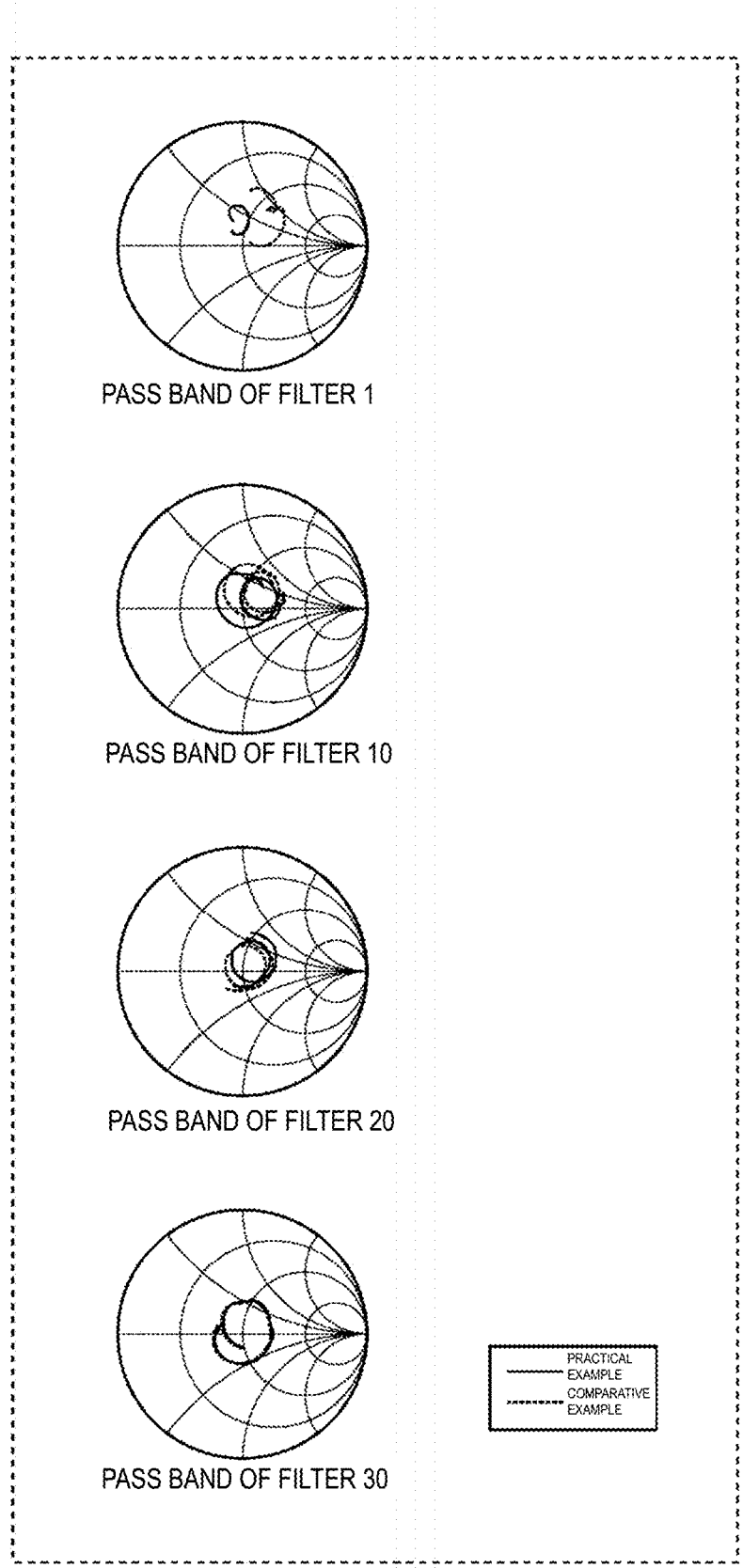
FIG. 8A provides Smith charts illustrating the impedance characteristic of a multiplexer according to the practical example when the multiplexer is viewed from a common terminal side.

FIG. 8A provides Smith charts illustrating the impedance characteristic of the multiplexer 100 according to the practical example when the multiplexer 100 is viewed from the common terminal 110 side. FIG. 8A provides Smith charts illustrating the impedance characteristic of the multiplexer 100 when viewed from the common terminal 110 side in, from the top, the pass band of the filter 1, the pass band of the filter 10, the pass band of the filter 20, and the pass band of the filter 30. In FIG. 8A, solid lines indicate the impedance characteristic of the practical example, and dashed lines indicate the impedance characteristic of the comparative example.

Figure 8B:
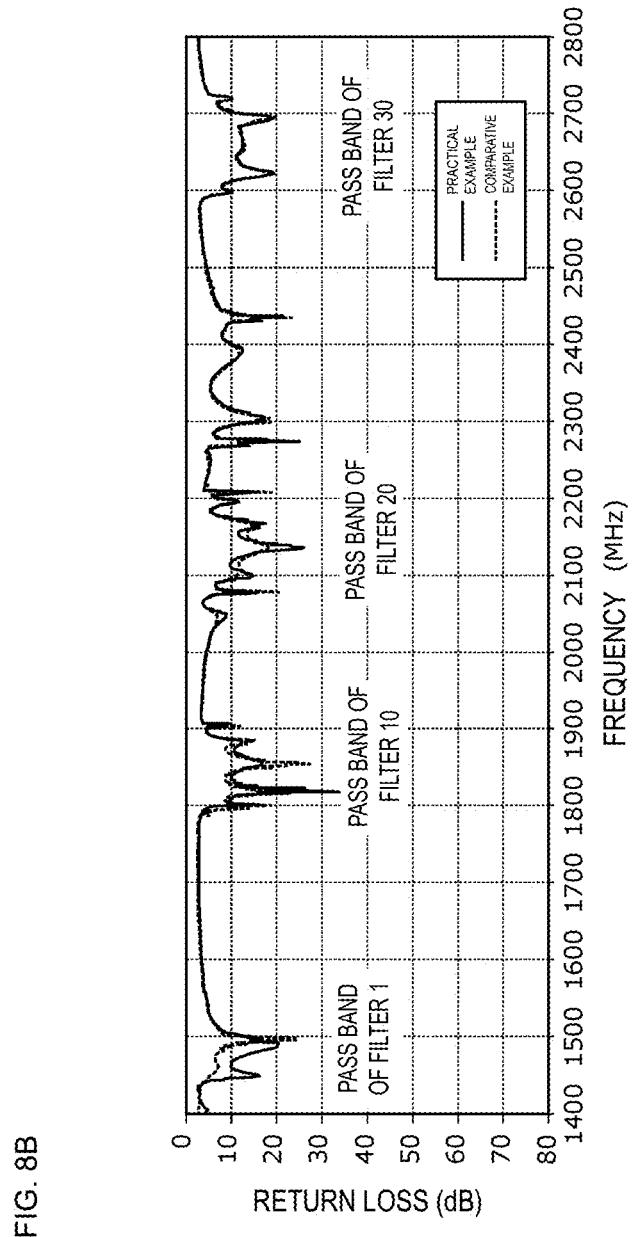
FIG. 8B is a graph illustrating the return loss characteristic of the multiplexer according to the practical example when the multiplexer is viewed from the common terminal side.

FIG. 8B is a graph illustrating the return loss characteristic of the multiplexer 100 according to the practical example when the multiplexer 100 is viewed from the common terminal 110 side. In FIG. 8B, a solid line indicates the return loss characteristic of the practical example, and a dashed line indicates the return loss characteristic of the comparative example.

FIGS. 8A and 8B illustrates the characteristics of the multiplexer 100 in carrier aggregation.

It can be understood that as illustrated in FIG. 8A, in the pass band of the filter 1, the impedance of the multiplexer 100 of the practical example is closer to about 50Ω than the comparative example. As illustrated in FIG. 4B, with consideration of the effect of coupling the filter 1 with other filters by common connection, the impedance of only the filter 1 is higher than 50Ω in the pass band of the filter 1. By contrast, the impedance of the multiplexer 100 including the filter 1 and other filters coupled by common connection is close to about 50Ω in the pass band of the filter 1.

As illustrated in FIG. 8B, the lowest return loss in the pass band of the filter 1 (about 1.452 GHz to about 1.496 GHz) is about 6 dB in the comparative example but about 10 dB in the practical example, which indicates an improvement of about 4 dB. Also in the pass band of the filter 10 (about 1.805 GHz to about 1.880 GHz), the lowest return loss is improved by about 1 dB to about 2 dB.

As described above, because in the practical example the total electrostatic capacitance of the input-side resonators of the longitudinally coupled resonator M1 is less than the total electrostatic capacitance of the output-side resonators, the return loss characteristic in carrier aggregation can be improved without adding matching elements. In other words, matching with the antenna terminal can be improved without adding matching elements.

6. Conclusion

As described above, the filter 1 includes the first input terminal 120 and the first output terminal 130, and the longitudinally coupled resonator M1 coupled between the first input terminal 120 and the first output terminal 130. The longitudinally coupled resonator M1 includes one or more input-side resonators (for example, the resonators D2 and D4) coupled to the first input terminal 120 and one or more output-side resonators (for example, the resonators D1, D3, and D5) coupled to the first output terminal 130. The total electrostatic capacitance of the one or more input-side resonators is less than the total electrostatic capacitance of the one or more output-side resonators.

In other words, the filter 1 includes the first input terminal 120 and the first output terminal 130, and the longitudinally coupled resonator M1 coupled between the first input terminal 120 and the first output terminal 130. The longitudinally coupled resonator M1 includes one or more input-side resonators (for example, the resonators D2 and D4) coupled to the first input terminal 120 and one or more output-side resonators (for example, the resonators D1, D3, and D5) coupled to the first output terminal 130. The one or more input-side resonators and the one or more output-side resonators each include an IDT electrode including a plurality of electrode fingers. The total of the product of the number of pairs of a plurality of electrode fingers of the IDT electrode and the overlap width of the electrode fingers of the individual one or more input-side resonators is smaller than the total of the product of the number of pairs of a plurality of electrode fingers of the IDT electrode and an overlap width of the electrode fingers of the individual one or more output-side resonators.

By designing the longitudinally coupled resonator M1 such that the total electrostatic capacitance of the one or more input-side resonators is less than the total electrostatic capacitance of the one or more output-side resonators, it is possible to improve the convergence level of impedance of the filter 1 when viewed from the first input terminal 120. In other words, the longitudinally coupled resonator M1 is designed such that the total of the product of the number of pairs of electrode fingers of the IDT electrode and the overlap width of the electrode fingers of the individual one or more input-side resonators is less than the total of the product of the number of pairs of electrode fingers of the IDT electrode and the overlap width of the electrode fingers of the individual one or more output-side resonators. This makes the total electrostatic capacitance of the one or more input-side resonators less than the total electrostatic capacitance of the one or more output-side resonators. As a result, it is possible to improve the convergence level of impedance of the filter 1 when viewed from the first input terminal 120. The less the input-side electrostatic capacitance of the longitudinally coupled resonator M1 is, the more the input-side impedance is. Thus, it is possible to increase the impedance of the filter 1 when viewed from the first input terminal 120. When the multiplexer 100 includes the filter 1 and other filters (for example, the filters 10, 20, and 30) coupled with the filter 1, the other filters affect the impedance characteristic of the filter 1. In anticipation of this effect, the impedance of the filter 1 before being coupled with other filters is previously increased by decreasing the input-side electrostatic capacitance of the longitudinally coupled resonator M1. With this configuration, when the multiplexer 100 includes the filter 1 and other filters coupled by common connection, the matching circuit 50 including a decreased number of elements can provide impedance matching.

For example, the electrostatic capacitance of each of the one or more input-side resonators may be less than the electrostatic capacitance of each of the one or more output-side resonators. In other words, the product of the number of pairs of the plurality of electrode fingers of the IDT electrode and the overlap width of the plurality of electrode fingers of each of the one or more input-side resonators may be smaller than the product of the number of pairs of the plurality of electrode fingers of the IDT electrode and the overlap width of the plurality of electrode fingers of each of the one or more output-side resonators.

This configuration can decrease more the total electrostatic capacitance of the one or more input-side resonators under the total electrostatic capacitance of the one or more output-side resonators. As a result, it is possible to further increase the input-side impedance of the longitudinally coupled resonator M1.

For example, the impedance of the longitudinally coupled resonator M1 at the high-frequency end of the pass band of the filter 1 when viewed from the first input terminal 120 side may be in the first quadrant of the Smith chart, and the impedance of the longitudinally coupled resonator M1 at the low-frequency end of the pass band of the filter 1 when viewed from the first input terminal 120 side may be in the fourth quadrant of the Smith chart.

With this configuration, while the convergence level of impedance is maintained, the impedance of the filter 1 when viewed from the first input terminal 120 side can be shifted toward infinity in the pass bands of other filters coupled by common connection. This means that it is possible to reduce or prevent degradation of the bandpass characteristic of the other filters.

For example, the filter 1 may further include the series arm resonator S1 provided in the path connecting the first input terminal 120 to the longitudinally coupled resonator M1, and the resonant frequency of the series arm resonator S1 may be within the pass band of the filter 1.

With this configuration, the impedance of the filter 1 when viewed from the first input terminal 120 side can be shifted toward infinity in the pass bands of other filters coupled by common connection.

For example, the filter 1 may further include the parallel arm resonator P1 coupled between the ground and the node N in the path connecting the first input terminal 120 to the longitudinally coupled resonator M1, and the anti-resonant frequency of the parallel arm resonator P1 may be within the pass band of the filter 1.

This configuration improves the convergence level of impedance.

The multiplexer 100 includes the common terminal 110, the filter 1, and one or more filters each including an input terminal and an output terminal. The first input terminal 120 and the input or output terminal of each of the one or more filters are coupled to the common terminal 110.

With this configuration, it is possible to provide the multiplexer 100 with an improved convergence level of impedance. Further, in the multiplexer 100, impedance matching is provided by the matching circuit 50 including a decreased number of elements.

For example, the pass band of the filter 1 and the pass band of each of the one or more filters may be included in the range of about 1.4 GHz to about 2.7 GHz. For example, in the multiplexer 100, the one or more filters may include the filters 10, 20, and 30; the pass band of the filter 1 may be from about 1.452 GHz to about 1.496 GHz; the pass band of the filter 10 may be from about 1.805 GHz to about 1.880 GHz; the pass band of the filter 20 may be from about 2.110 GHz to about 2.170 GHz, and the pass band of the filter 30 may be from about 2.620 GHz to about 2.690 GHz.

OTHER PREFERRED EMBODIMENTS

The above has described the filter 1 (an acoustic wave filter) and the multiplexer 100 according to the preferred embodiments the present invention, but the present invention also embraces other preferred embodiments implemented as any combination of the elements of the preferred embodiments described above, and other modified examples obtained by making various modifications to the preferred embodiments that occur to those skilled in the art without departing from the scope of the present invention.

For example, the filter 1 and the multiplexer 100 according to the preferred embodiments may be used in a radio-frequency front-end circuit, and further in a communication device including a radio-frequency front-end circuit. The present invention also embraces various hardware devices including a radio-frequency front-end circuit and a communication device using the filter 1 or the multiplexer 100.

For example, in the preferred embodiments, the example in which the electrostatic capacitance of each of the one or more input-side resonators is less than the electrostatic capacitance of each of the one or more output-side resonators is described, but the one or more input-side resonators may include a resonator of an electrostatic capacitance more than the electrostatic capacitance of any of the one or more output-side resonators.

For example, in the preferred embodiments, the example in which the impedance of the longitudinally coupled resonator M1 at the high-frequency end of the pass band of the filter 1 when viewed from the first input terminal 120 side is in the first quadrant of the Smith chart is described, but the impedance of the longitudinally coupled resonator M1 is not necessarily in the first quadrant. Further, the example in which the impedance of the longitudinally coupled resonator M1 at the low-frequency end of the pass band of the filter 1 when viewed from the first input terminal 120 side is in the fourth quadrant of the Smith chart is described, but the impedance of the longitudinally coupled resonator M1 is not necessarily in the fourth quadrant.

For example, in the preferred embodiments, the example in which the filter 1 includes the series arm resonator S1 is described, but the series arm resonator S1 is not necessarily included.

For example, in the preferred embodiments, the example in which the filter 1 includes the parallel arm resonator P1 is described, but the parallel arm resonator P1 is not necessarily included.

Preferred embodiments of the present invention can be used, acoustic wave filters and multiplexers operable in multiband systems, in a wide variety of communication devices such as mobile phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:
    a first input terminal and a first output terminal; and
    a longitudinally coupled resonator coupled in series in a path between the first input terminal and the first output terminal; wherein
    the path is the only path connecting the first input terminal to the first output terminal;
    the longitudinally coupled resonator includes one or more input-side resonators coupled to the first input terminal and one or more output-side resonators coupled to the first output terminal; and
    a total electrostatic capacitance of the one or more input-side resonators is less than a total electrostatic capacitance of the one or more output-side resonators.

2. The acoustic wave filter according to claim 1, wherein an electrostatic capacitance of each of the one or more input-side resonators is less than an electrostatic capacitance of each of the one or more output-side resonators.

3. The acoustic wave filter according to claim 1, wherein
    an impedance of the longitudinally coupled resonator at a high-frequency end of a pass band of the acoustic wave filter when the longitudinally coupled resonator is viewed from a first input terminal side is in a first quadrant of a Smith chart; and
    an impedance of the longitudinally coupled resonator at a low-frequency end of the pass band of the acoustic wave filter when the longitudinally coupled resonator is viewed from the first input terminal side is in a fourth quadrant of the Smith chart.

4. The acoustic wave filter according to claim 1, further comprising:
    a series arm resonator provided in a path connecting the first input terminal and the longitudinally coupled resonator; wherein a resonant frequency of the series arm resonator is within a pass band of the acoustic wave filter.

5. The acoustic wave filter according to claim 1, further comprising:
a parallel arm resonator coupled between ground and a node in a path connecting the first input terminal and the longitudinally coupled resonator; wherein
an anti-resonant frequency of the parallel arm resonator is within a pass band of the acoustic wave filter.

6. A multiplexer comprising:
a common terminal;
the acoustic wave filter according to claim 1; and
one or more filters each including an input terminal and an output terminal; wherein
the first input terminal and the input terminal or the output terminal of each of the one or more filters are coupled to the common terminal.

7. The multiplexer according to claim 6, wherein a pass band of the acoustic wave filter and a pass band of each of the one or more filters are included in a range of about 1.4 GHz to about 2.7 GHz.

8. The multiplexer according to claim 7, wherein
the one or more filters include a first filter, a second filter, and a third filter;
the pass band of the acoustic wave filter is from about 1.452 GHz to about 1.496 GHZ;
the pass band of the first filter is from about 1.805 GHz to about 1.880 GHz;
the pass band of the second filter is from about 2.110 GHz to about 2.170 GHz; and
the pass band of the third filter is from about 2.620 GHz to about 2.690 GHz.

9. The multiplexer according to claim 6, wherein an electrostatic capacitance of each of the one or more input-side resonators is less than an electrostatic capacitance of each of the one or more output-side resonators.

10. The multiplexer according to claim 6, wherein
an impedance of the longitudinally coupled resonator at a high-frequency end of a pass band of the acoustic wave filter when the longitudinally coupled resonator is viewed from a first input terminal side is in a first quadrant of a Smith chart; and
an impedance of the longitudinally coupled resonator at a low-frequency end of the pass band of the acoustic wave filter when the longitudinally coupled resonator is viewed from the first input terminal side is in a fourth quadrant of the Smith chart.

11. The multiplexer according to claim 6, further comprising:
a series arm resonator provided in a path connecting the first input terminal and the longitudinally coupled resonator; wherein
a resonant frequency of the series arm resonator is within a pass band of the acoustic wave filter.

12. The multiplexer according to claim 6, further comprising:
a parallel arm resonator coupled between ground and a node in a path connecting the first input terminal and the longitudinally coupled resonator; wherein
an anti-resonant frequency of the parallel arm resonator is within a pass band of the acoustic wave filter.

13. An acoustic wave filter comprising:
a first input terminal and a first output terminal; and
a longitudinally coupled resonator coupled between the first input terminal and the first output terminal; wherein
the longitudinally coupled resonator includes one or more input-side resonators coupled to the first input terminal and one or more output-side resonators coupled to the first output terminal;
the one or more input-side resonators and the one or more output-side resonators each include an interdigital transducer (IDT) electrode including a plurality of electrode fingers; and
a total of a product of a number of pairs of the plurality of electrode fingers of the IDT electrode and an overlap width of the plurality of electrode fingers of the individual one or more input-side resonators is smaller than a total of a product of a number of pairs of the plurality of electrode fingers of the IDT electrode and an overlap width of the plurality of electrode fingers of the individual one or more output-side resonators.

14. The acoustic wave filter according to claim 13, wherein the product of the number of pairs of the plurality of electrode fingers of the IDT electrode and the overlap width of the plurality of electrode fingers of each of the one or more input-side resonators is smaller than the product of the number of pairs of the plurality of electrode fingers of the IDT electrode and the overlap width of the plurality of electrode fingers of each of the one or more output-side resonators.

15. The acoustic wave filter according to claim 13, wherein
an impedance of the longitudinally coupled resonator at a high-frequency end of a pass band of the acoustic wave filter when the longitudinally coupled resonator is viewed from a first input terminal side is in a first quadrant of a Smith chart; and
an impedance of the longitudinally coupled resonator at a low-frequency end of the pass band of the acoustic wave filter when the longitudinally coupled resonator is viewed from the first input terminal side is in a fourth quadrant of the Smith chart.

16. The acoustic wave filter according to claim 13, further comprising:
a series arm resonator provided in a path connecting the first input terminal and the longitudinally coupled resonator; wherein
a resonant frequency of the series arm resonator is within a pass band of the acoustic wave filter.

17. The acoustic wave filter according to claim 13, further comprising:
a parallel arm resonator coupled between ground and a node in a path connecting the first input terminal and the longitudinally coupled resonator; wherein
an anti-resonant frequency of the parallel arm resonator is within a pass band of the acoustic wave filter.

18. A multiplexer comprising:
a common terminal;
the acoustic wave filter according to claim 13; and
one or more filters each including an input terminal and an output terminal; wherein
the first input terminal and the input terminal or the output terminal of each of the one or more filters are coupled to the common terminal.

19. The multiplexer according to claim 18, wherein a pass band of the acoustic wave filter and a pass band of each of the one or more filters are included in a range of about 1.4 GHz to about 2.7 GHZ.

20. The multiplexer according to claim 19, wherein
the one or more filters include a first filter, a second filter, and a third filter;

the pass band of the acoustic wave filter is from about 1.452 GHz to about 1.496 GHz;
the pass band of the first filter is from about 1.805 GHz to about 1.880 GHz;
the pass band of the second filter is from about 2.110 GHz to about 2.170 GHz; and
the pass band of the third filter is from about 2.620 GHz to about 2.690 GHz.

* * * * *